(12) United States Patent
Kim

(10) Patent No.: US 9,230,897 B2
(45) Date of Patent: Jan. 5, 2016

(54) SEMICONDUCTOR DEVICES HAVING THROUGH-SUBSTRATE VIA PLUGS AND SEMICONDUCTOR PACKAGES INCLUDING THE SAME

(71) Applicant: Samsung Electronics Co., Ltd., Suwon-si (KR)

(72) Inventor: Young-Bae Kim, Hwaseong-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/324,386

(22) Filed: Jul. 7, 2014

(65) Prior Publication Data

US 2015/0179558 A1 Jun. 25, 2015

(30) Foreign Application Priority Data

Dec. 20, 2013 (KR) ........................ 10-2013-0160543

(51) Int. Cl.
*H01L 23/498* (2006.01)
*H01L 23/522* (2006.01)
*H01L 23/538* (2006.01)

(52) U.S. Cl.
CPC ...... *H01L 23/49816* (2013.01); *H01L 23/5226* (2013.01); *H01L 23/5384* (2013.01); *H01L 2224/16225* (2013.01); *H01L 2924/15311* (2013.01)

(58) Field of Classification Search
CPC .................... H01L 23/49816; H01L 23/5226; H01L 23/5384
See application file for complete search history.

(56) References Cited

U.S. PATENT DOCUMENTS

| 7,812,438 | B2 | 10/2010 | Jadhav et al. |
| 7,863,525 | B2 | 1/2011 | Miyagawa |
| 2010/0207271 | A1 | 8/2010 | Omi |
| 2011/0147895 | A1 | 6/2011 | Bai et al. |
| 2013/0037950 | A1* | 2/2013 | Yu ................... H01L 23/49816 257/738 |
| 2014/0048929 | A1* | 2/2014 | Cha et al. ................... 257/737 |

FOREIGN PATENT DOCUMENTS

KR  10-2010-0094943 A  8/2010

* cited by examiner

*Primary Examiner* — Julio J Maldonado
*Assistant Examiner* — Farun Lu
(74) *Attorney, Agent, or Firm* — Muir Patent Law, PLLC

(57) ABSTRACT

Provided is a semiconductor package including a package substrate having lands, a first semiconductor device mounted on the package substrate and having a bottom surface on which first lines are disposed, and solder balls respectively electrically connected to the lands of the package substrate with the first lines of the first semiconductor device. The first semiconductor device includes a first substrate, and through-substrate via (TSV) plugs that vertically pass through the first substrate. The TSV plugs are respectively vertically aligned with the first lines, overlap first regions corresponding to 70% or less of diameters of the solder balls from central axes of the solder balls, and do not overlap second regions corresponding to the remaining 30% or more of diameters of the solder balls from the central axes of the solder balls. Adjacent ones of the TSV plugs are arranged at irregular intervals with respect to each other.

13 Claims, 12 Drawing Sheets

SEMICONDUCTOR DEVICES HAVING THROUGH-SUBSTRATE VIA PLUGS AND SEMICONDUCTOR PACKAGES INCLUDING THE SAME

CROSS-REFERENCE TO RELATED APPLICATION

This application claims priority under 35 U.S.C. §119 to Korean Patent Application No. 10-2013-0160543 filed on Dec. 20, 2013, the disclosure of which is hereby incorporated by reference in its entirety.

BACKGROUND

Embodiments of the present disclosure provide semiconductor devices having through-substrate via (e.g., through-silicon via (TSV)) plugs and semiconductor packages including the same.

With an increase in the integration density of semiconductor devices, a semiconductor device having TSV plugs formed through a substrate of the semiconductor device has been proposed. In general, a disposed location of the TSV plugs is important to improve a reliability of a semiconductor device.

SUMMARY

Embodiments of the inventive concept provide a semiconductor device having through-substrate via (TSV) plugs.

Other embodiments of the inventive concept provide a semiconductor package including a semiconductor device having TSV plugs.

In accordance with an aspect of the inventive concept, a semiconductor package includes a package substrate having lands, a first semiconductor device mounted on the package substrate and having a bottom surface on which first lines are disposed, and solder balls respectively electrically connected to the lands of the package substrate and the first lines of the first semiconductor device. The first semiconductor device includes a first substrate and TSV plugs that pass through the first substrate. The TSV plugs are respectively vertically aligned with the first lines and overlap first regions corresponding to 70% or less of diameters of the solder balls from central axes of the solder balls, and do not overlap second regions corresponding to the remaining 30% or more of diameters of the solder balls from the central axes of the solder balls, and adjacent ones of the TSV plugs are arranged at irregular intervals with respect to each other.

In accordance with another aspect of the inventive concept, a semiconductor device includes a first substrate, a first insulating layer disposed on the first substrate, TSV plugs passed through the first substrate and the first insulating layer, TSV pads formed on the first insulating layer and aligned with the respective TSV plugs, a second insulating layer formed on the first insulating layer to cover the TSV pads, internal vias passed through the second insulating layer and connected to the respective TSV pads, first pads formed on the second insulating layer and electrically connected to the respective internal vias, a third insulating layer formed on a bottom surface of the first substrate, first lines disposed on the third insulating layer, and a passivation layer formed on the third insulating layer to expose portions of surfaces of the first lines. The TSV plugs are vertically aligned with the first lines, overlap first regions corresponding to 70% of horizontal widths of the first lines from centers of the first lines, and do not overlap second regions corresponding to the remaining 30% or more.

In accordance with still another aspect of the inventive concept, a semiconductor package includes a package substrate; solder balls disposed on the package substrate; a first semiconductor device including a first substrate and through-substrate via (TSV) plugs that vertically pass through the first substrate; and a second semiconductor device electrically connected to the first semiconductor device. The TSV plugs connect the first semiconductor device to solder balls between the first semiconductor device and the package substrate adjacent to the first semiconductor device. Each respective TSV plug vertically overlaps a central region corresponding to 70% or less of a diameter of its respective solder ball, and does not overlap outside regions on either side of the central region, each outside region corresponding to 15% or more of the diameter of the respective solder ball.

Specific particulars of other embodiments are included in detailed descriptions and drawings.

BRIEF DESCRIPTION OF THE DRAWINGS

The foregoing and other features of the disclosure will be apparent from the more particular description of various example embodiments, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
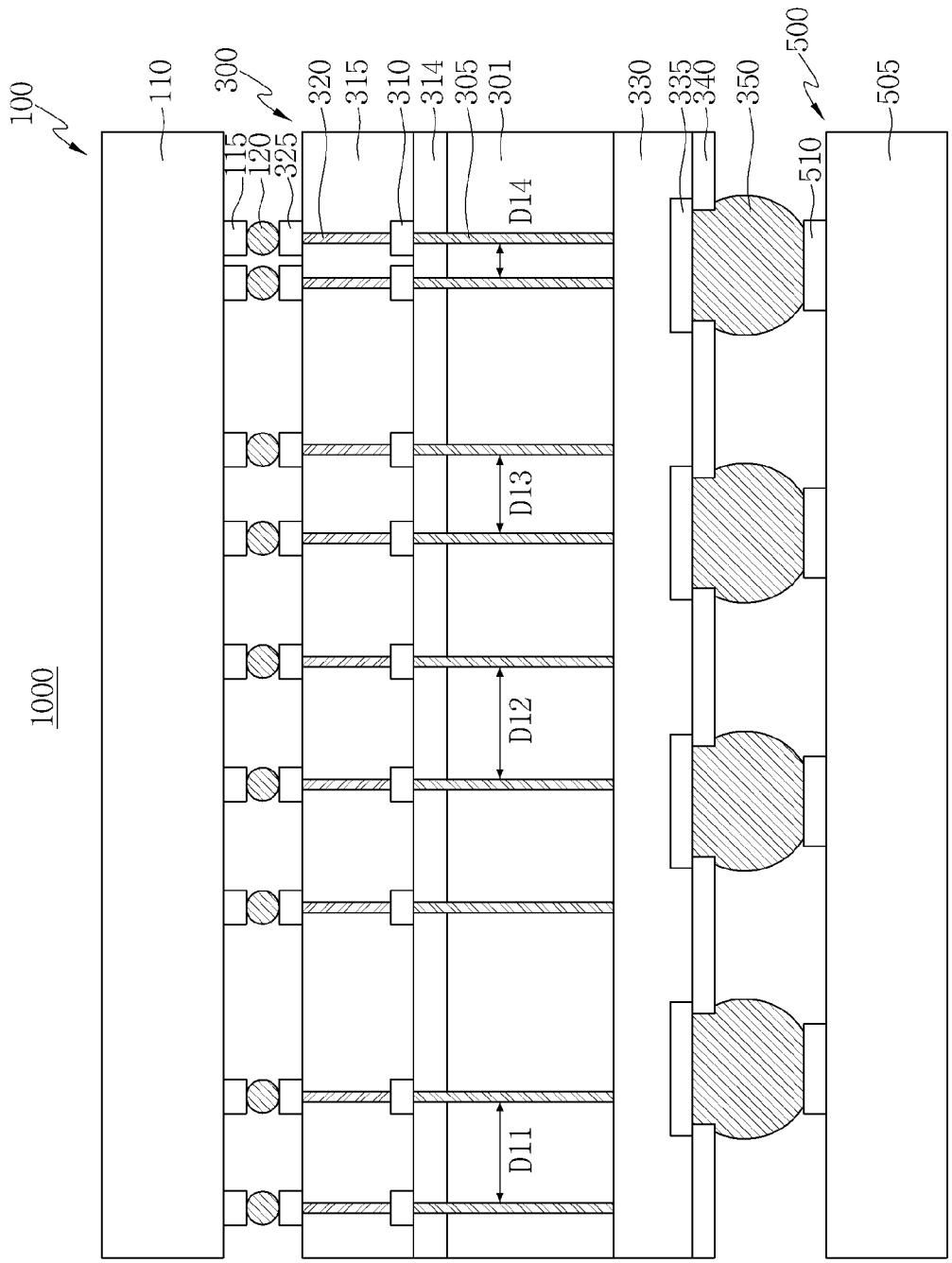
FIG. 1 is a longitudinal sectional view of a structure of a semiconductor package including a semiconductor device according to example embodiments.

Exemplary embodiments will be described more fully hereinafter with reference to the accompanying drawings, in which embodiments of the disclosure are shown. This disclosure may, however, be embodied in many different forms and should not be construed as limited to the embodiments set forth herein.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. Expressions such as "at least one of," when preceding a list of elements, modify the entire list of elements and do not modify the individual elements of the list. It will be further understood that the terms "comprises," "comprising," "includes,"

and/or "including," when used herein, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items. The term "contact," as used herein, refers to a direct contact, unless indicated otherwise.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

Embodiments of the inventive concept are described herein with reference to cross-section and/or plan illustrations that are schematic illustrations of idealized embodiments of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to limit the scope of the disclosure.

Unless the context indicates otherwise, terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

It will be also understood that although the terms first, second, third etc. may be used herein to describe various elements, these elements should not be limited by these terms. Unless indicated otherwise, these terms are only used to distinguish one element from another element. Thus, a first element in some embodiments could be termed a second element in other embodiments without departing from the teachings of the present disclosure. Exemplary embodiments of aspects of the present disclosure explained and illustrated herein include their complementary counterparts.

Like numbers refer to like elements throughout. Thus, the same or similar numbers may be described with reference to other drawings even if they are neither mentioned nor described in the corresponding drawing. Also, even elements that are not denoted by reference numbers may be described with reference to other drawings.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a longitudinal sectional view of a structure of a semiconductor package including a semiconductor device according to example embodiments, and FIGS. 2 through 5 are longitudinal sectional views showing a connection relationship between a through-silicon via (TSV) plug and a solder ball of FIG. 1 according to example embodiments.

Referring to FIG. 1, a semiconductor package 1000 includes an upper semiconductor device 100, a lower semiconductor device 300, and a package substrate 500. For example, the upper semiconductor device 100 may include a memory chip, and the lower semiconductor device 300 may include a logic chip. For example, the memory chip or the logic chip may be a piece of a semiconductor wafer (e.g., a single crystalline silicon (Si) wafer, a silicon germanium (SiGe) wafer, or a silicon-on-insulator (SOI) wafer).

The package substrate 500 may include a body 505 and bump lands 510 disposed on a top surface of the body 505. The body 505 may include a printed circuit board (PCB). The bump lands 510 may include a conductive material, for example a metal, such as copper (Cu), and may be referred to herein generally as conductive terminals. In one embodiment, the bump lands 510 may be buried in the body 505. As an example, the bump lands may be a patterned conductive layer formed on or in the body 505 of the package substrate 500.

The lower semiconductor device 300 may include a lower substrate 301, a middle insulating layer 314, an upper insulating layer 315, a lower insulating layer 330, through-substrate via (e.g., through-silicon via (TSV)) plugs 305 (also referred to as through electrodes), TSV pads 310, internal vias 320, lower pads 325, lower lines 335, and a passivation layer 340.

The lower substrate 301 may include, for example, a single crystalline silicon wafer, a silicon germanium (SiGe) wafer, or a silicon-on-insulator (SOI) wafer.

The middle insulating layer 314 may be directly formed on a top surface of the lower substrate 301. The upper insulating layer 315 may be directly formed on the middle insulating layer 314. The lower insulating layer 330 may be formed on a bottom surface of the lower substrate 301. The middle insulating layer 314, the upper insulating layer 315, and the lower insulating layer 330 may include, for example, silicon oxide or silicon nitride.

The TSV plugs 305 may vertically pass through the lower substrate 301 and the middle insulating layer 314. For example, the TSV plugs 305 may pass through the entire the lower substrate 301, from the top surface to the bottom surface of the lower substrate 301. In certain embodiments, the TSV plugs 305 may be formed of a conductive material, and may include a metal, such as copper. The TSV plugs 305 may be irregularly arranged in the lower substrate 301. For example, adjacent ones of the TSV plugs 305 may be irregularly arranged at different intervals. Intervals D11, D12, D13, and D14 among the adjacent ones of the TSV plugs 305 may be irregularly various and different from one another. In certain embodiments, the lower semiconductor device 300 may include at least three TSV plugs 305, and intervals among pairs selected out of the three TSV plugs 305 may be different. For example, a distance between two TSV plugs of a first pair may be smaller than the distance between two TSV plugs of a second pair, and larger than the distance between two TSV plugs of a third pair. Also, a distance between a first pair and a second pair adjacent to the first pair may be different from a distance between the first pair and a third pair adjacent to the first pair.

The TSV pads 310 may be disposed on the middle insulating layer 314 in contact with the TSV plugs 305. The TSV pads 310 may be formed of a conductive material, and may include a metal, such as titanium, tungsten, or copper. The TSV pads 310 may be irregularly arranged to correspond to the arrangement of the TSV plugs 305. For example, adjacent ones of the TSV pads 310 may be arranged at irregular intervals.

The internal vias 320 may pass through the upper insulating layer 315 and connect the TSV pads 310 with the lower pads 325. The internal vias 320 may be formed of a conductive material, and may include a metal, such as titanium, tungsten, or copper. Internal vias may correspond to and be formed along the same vertical line as TSV plugs. Though the TSV plugs 305 and internal vias 320 may both be vertical conductive vias, they differ in that the TSV plugs 305 pass through a substrate, such as a silicon substrate (which may be formed, for example, of a semiconductor material), whereas the internal vias 320 pass through an insulation layer.

The lower pads 325 may be disposed on the upper insulating layer 315. The lower lines 335 may be disposed on the lower insulating layer 330 (e.g., the lower lines 335 may be referred to as first lines). The lower pads 325 and the lower lines 335 may include a metal, such as copper, nickel (Ni), or silver (Ag). The lower lines 335 may be regularly arranged. For instance, adjacent ones of the lower lines 335 may be arranged at equal intervals.

The passivation layer 340 may be formed on the lower insulating layer 330 and expose the lower lines 335. The passivation layer 340 may include, for example, silicon nitride or polyimide.

The upper semiconductor device 100 may include an upper substrate 110 and upper pads 115 disposed on a bottom surface of the upper substrate 110. The upper pads 115 may include, for example, an external power supply pad, an external ground pad, and external signal pads. The external signal pads may include an input signal pad and an output signal pad. The upper pads 115 may include a metal, such as copper, nickel, or silver.

In one embodiment, the lower semiconductor device 300 may be mounted on the package substrate 500. The lower semiconductor device 300 and the package substrate 500 may be physically and electrically connected to each other through solder balls 350. The solder balls 350, more generally referred to herein as conductive terminals may be provided on the bump lands 510 of the package substrate 500 and in contact with the lower lines 335 of the lower semiconductor device 300. A solder ball 350 and/or its respective bump land 510 may be referred to either individually or collectively as a conductive terminal, or a conductive interconnection terminal.

In one embodiment, the upper semiconductor device 100 may be stacked on the lower semiconductor device 300. The upper pads 115 of the upper semiconductor device 100 may be physically and electrically connected to the lower pads 325 of the lower semiconductor device 300 through inter-chip bumps 120. The inter-chip bumps 120 may include, for example, a solder material, and may be raised from the surface of the lower semiconductor device and have curved features. A respective upper pad 115, lower pad 325, and inter-chip bump 120 may be referred to herein as a conductive terminal, or more specifically an inter-chip conductive terminal.

The lower insulating layer 330 may include conductive lines (not shown) connecting TSV plugs 305 to corresponding solder balls 350. In one embodiment, the lower insulating layer 330 including conductive lines may be referred to as a redistribution layer. Thus, the conductive lines may be redistribution lines. In one embodiment, several TSV plugs may commonly connect to one of the solder balls. For example, two TSV plugs can be connected to one solder ball.

Referring to FIGS. 2 through 5, the TSV plugs 305 may vertically overlap and be vertically aligned with the solder balls 350 and the lower lines 335. The TSV plugs 305 may neither overlap nor be aligned with outer regions R12, R13, R22, R23, R32, R33, R42, and R43 of the solder balls 350 but overlap and be aligned with central regions R11, R21, R31, and R41 of the solder balls 350. Each of the central regions R11, R21, R31, and R41 may have, for example, a circular shape and include about 60 to 70% of a diameter of the solder ball 350 or a horizontal width of the lower line 335 from the central axis C. Accordingly, each of the outer regions R12, R13, R22, R23, R32, R33, R42, and R43 may have a disc shape and include about 15 to 20% of the diameter of the solder ball 350 or the horizontal width of the lower line 335 from outer end portions of the solder ball 350 or the lower line 335.

Figure 2:
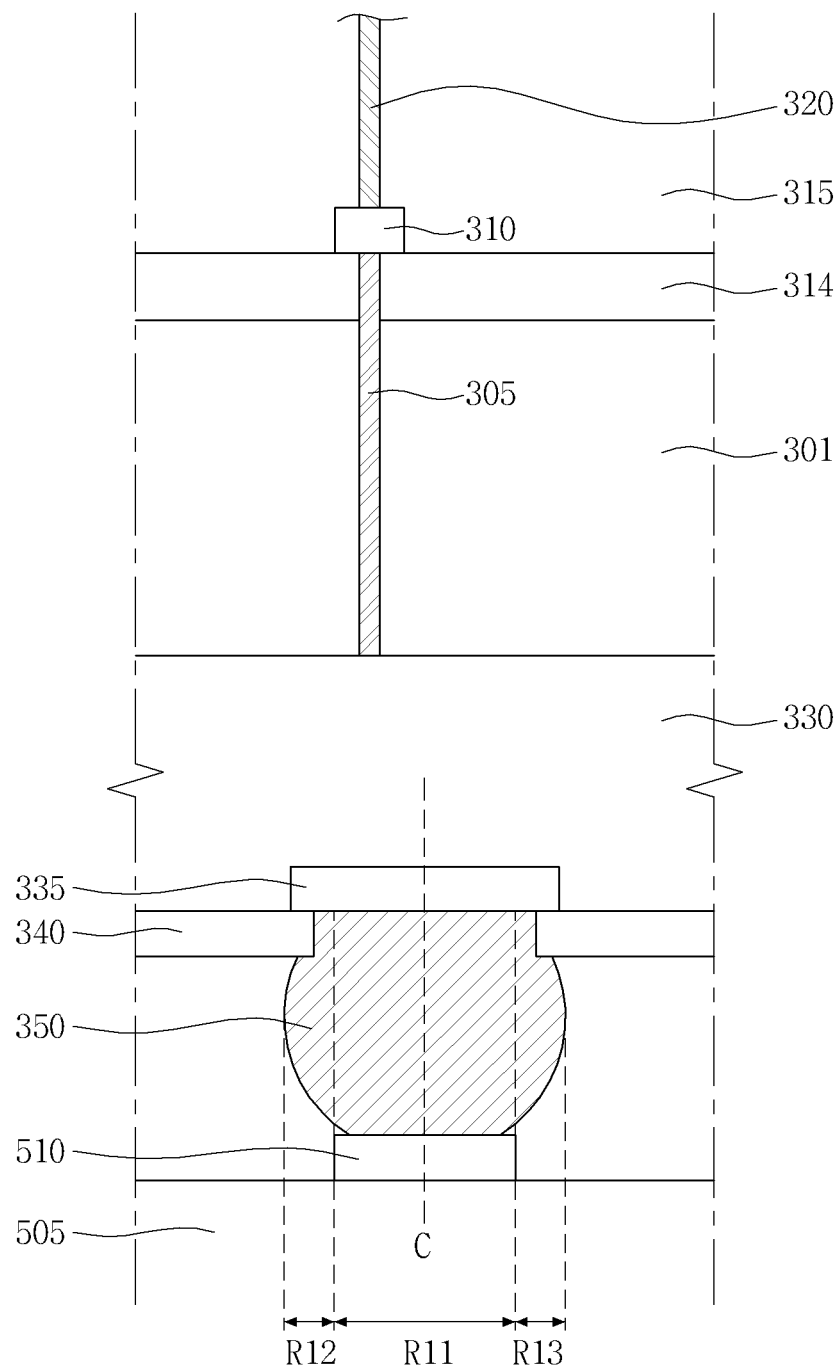
FIGS. 2 through 5 are longitudinal sectional views showing a connection relationship between a through-silicon via (TSV) plug and a solder ball of FIG. 1 according to example embodiments.
Figure 3:
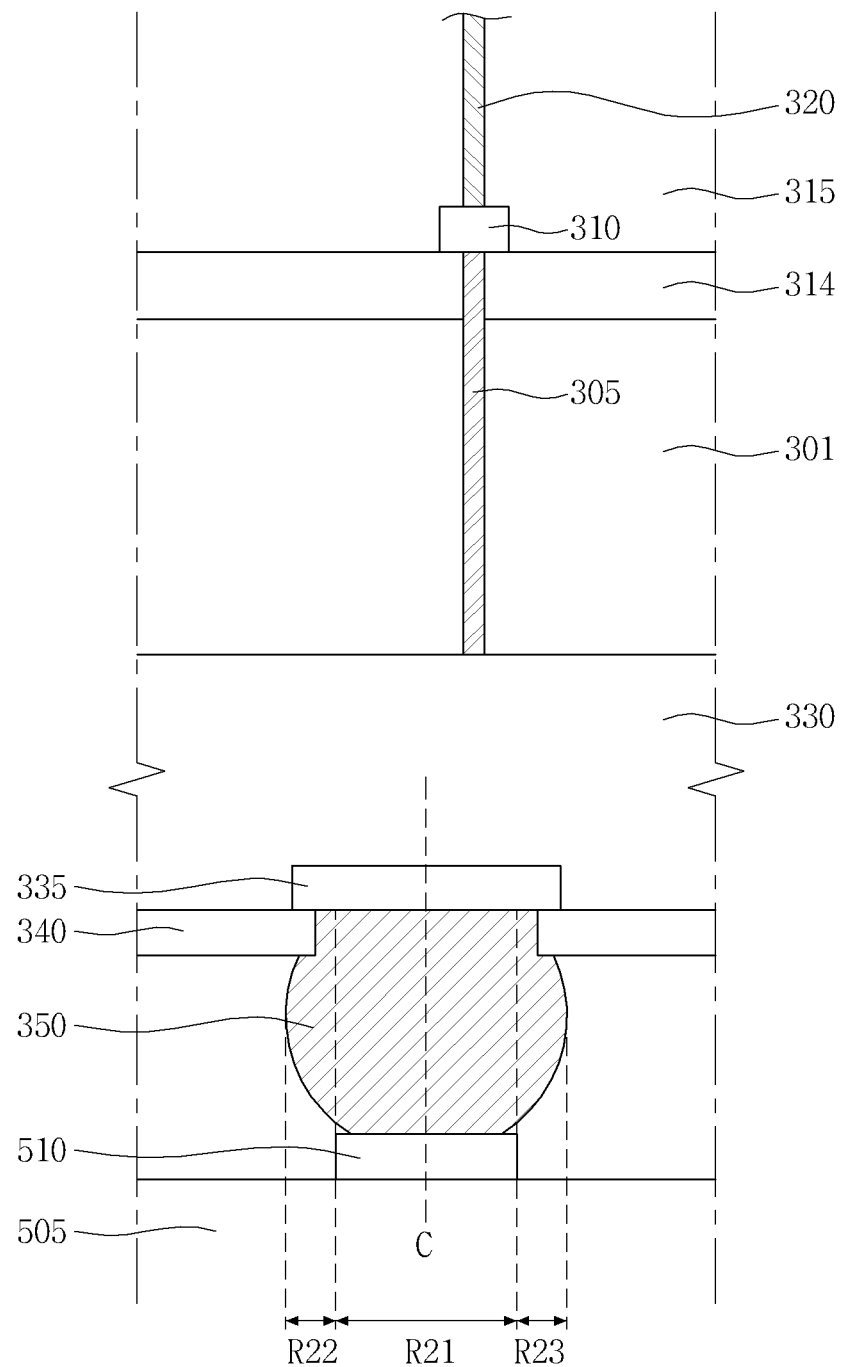

Referring to FIGS. 2 and 3, the TSV plugs 305 according to one embodiment may vertically overlap and be vertically aligned with the central regions R11 and R21 of the solder balls 350 but may neither overlap nor be aligned with the central axis C. For example, a first one of the TSV plugs 305 may be vertically aligned at the left side of any one of the central regions R11 and R21 (e.g., thus having a diameter equal to or less than 30-35% of a diameter of a corresponding solder ball with which it vertically overlaps), and a second one of the TSV plugs 305 may be vertically aligned at the right side of any one of the central regions R11 and R21 (e.g., thus having a diameter equal to or less than another 30-35% of the diameter of the corresponding solder ball with which it vertically overlaps).

Figure 4:
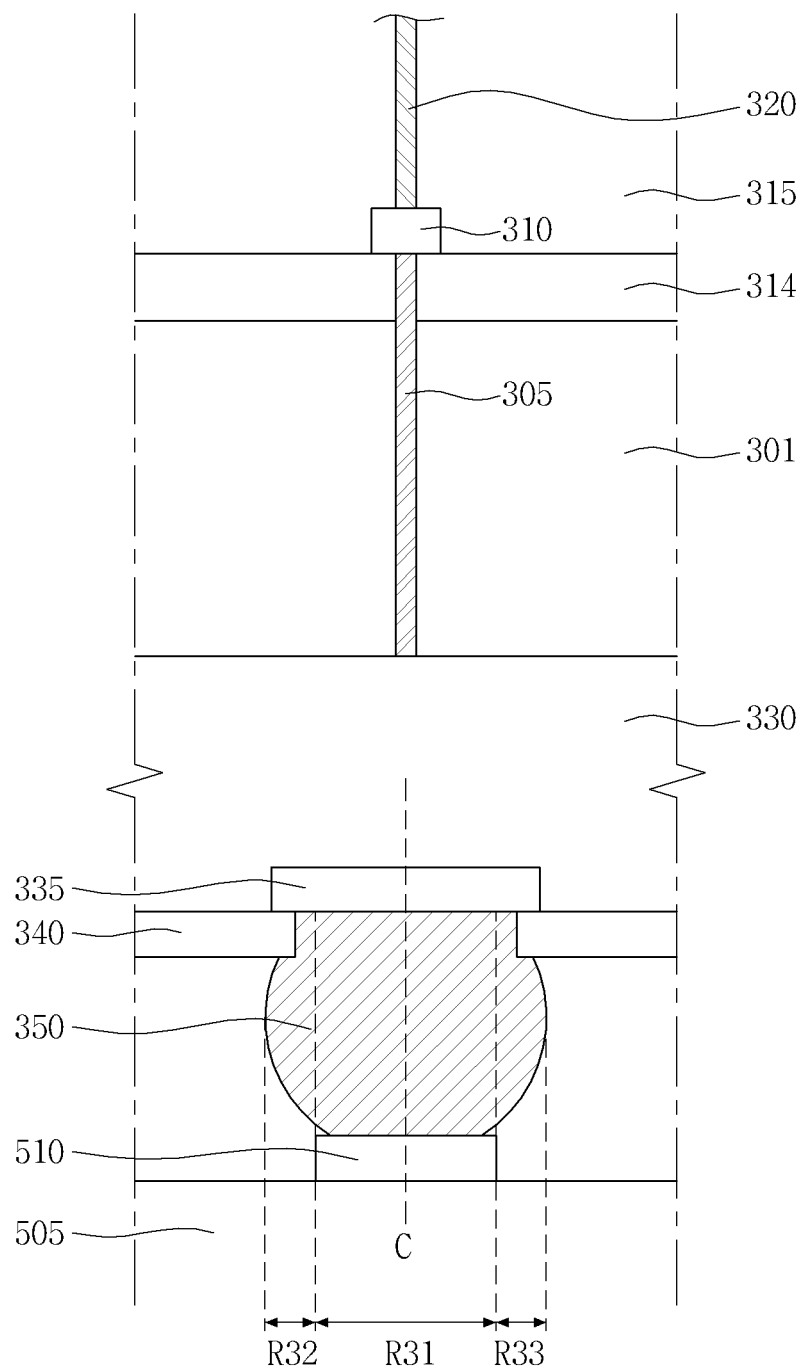

Referring to FIG. 4, in one embodiment, the TSV plug 305 may vertically overlap and be vertically aligned with the central region R31 of the solder ball 350 and overlap and be aligned with the central axis C. For example, a third one of the TSV plugs 305 may be vertically aligned with a central axis C of any one of the solder balls 350.

Figure 5:
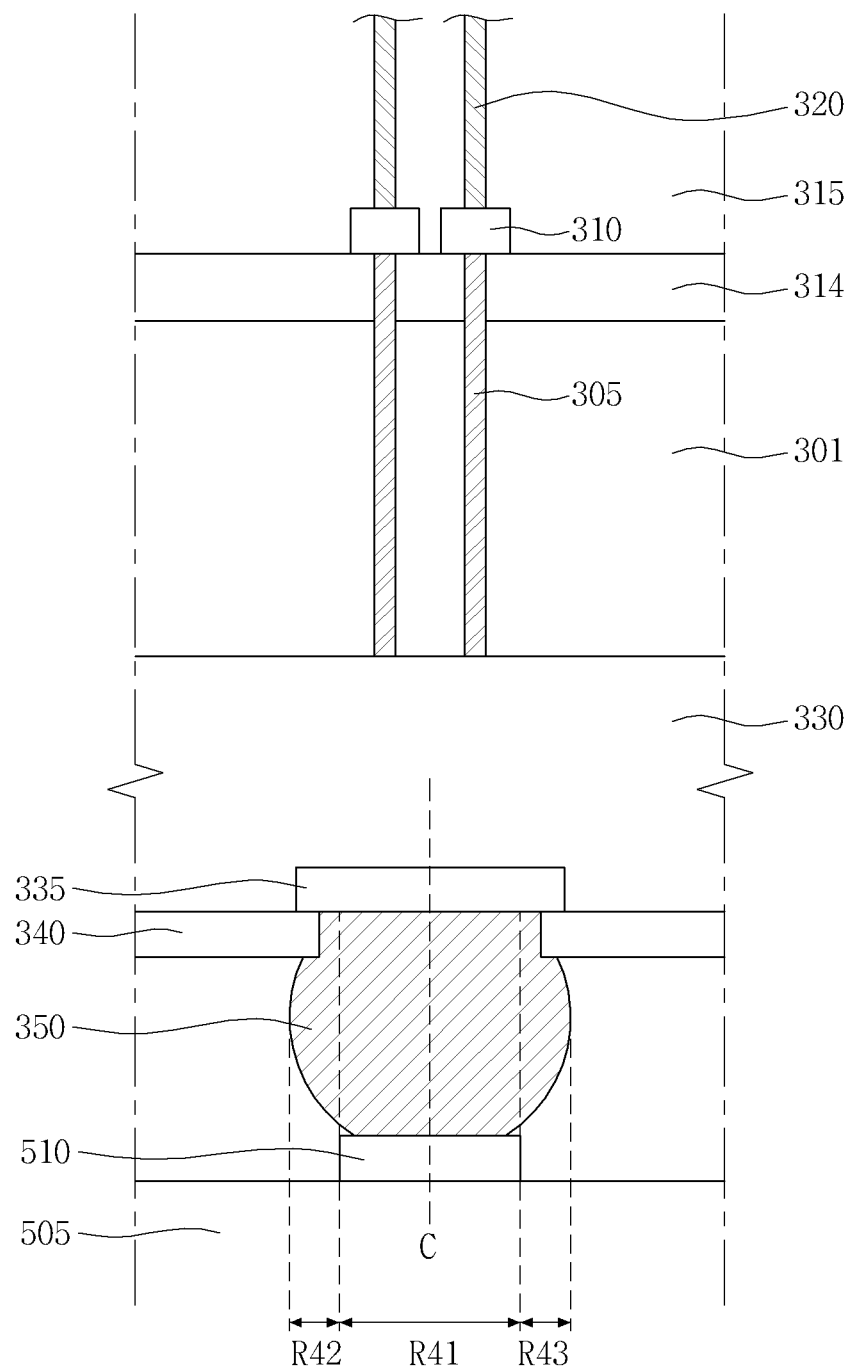

Referring to FIG. 5, at least two TSV plugs 305 may vertically overlap and be vertically aligned with the central region R41 of the solder ball 350. For example, both fourth and fifth ones of the TSV plugs 305 may be vertically aligned with one of the lower lines 335 and one solder ball 350. Each TSV plug 305 may have a diameter, for example, equal to or less than 30-35% of the diameter of the solder ball 350 that it vertically overlaps.

Since the TSV plugs 305 may be irregularly arranged in the lower substrate 301 from a top view or a cross-sectional view, and vertically aligned with the central regions R11, R21, R31, and R41 corresponding to about 60 to 70% of the diameters of the solder balls 350 from the central axes C thereof, stress caused between the TSV plugs 305 and the solder balls 350 may be alleviated. Accordingly, occurrence of cracks and delamination in the lower substrate 301 may be prevented.

Figure 6:
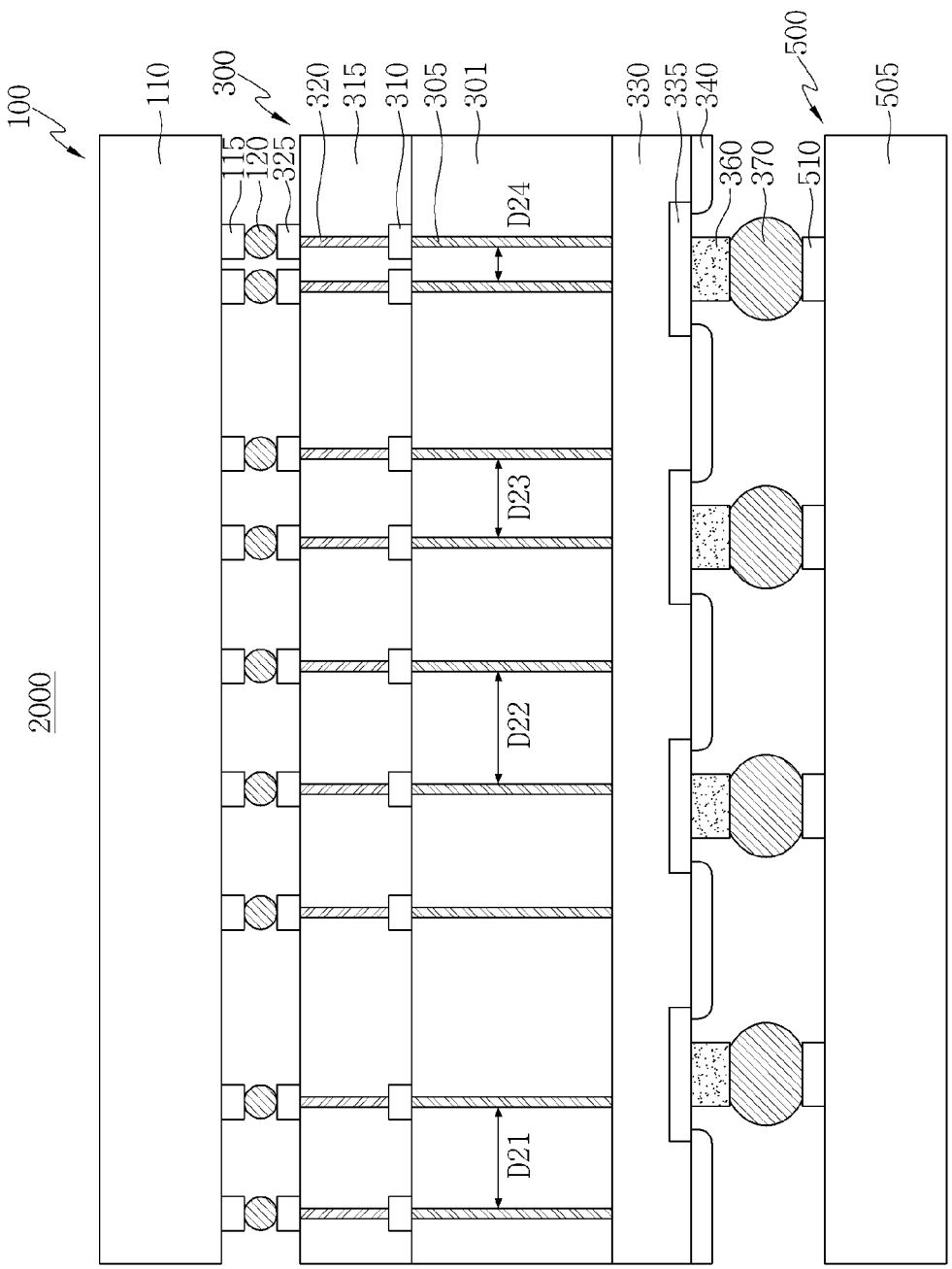
FIG. 6 is a longitudinal sectional view of a structure of a semiconductor package including a semiconductor device according to example embodiments.

FIG. 6 is a longitudinal sectional view of a structure of a semiconductor package including a semiconductor device according to example embodiments, and FIGS. 7 through 10 are longitudinal sectional views showing a connection relationship between a TSV plug and a pillar of FIG. 6 according to example embodiments.

Referring to FIG. 6, a semiconductor package 2000 includes an upper semiconductor device 100, a lower semiconductor device 300, and a package substrate 500. Structures of the upper semiconductor device 100, the package substrate 500, and some parts of the lower semiconductor device 300 may be the same as those described in FIG. 1. Thus, a detailed description of the upper semiconductor device 100, the package substrate 500, and some parts of the lower semiconductor device 300 will be omitted. The lower semiconductor device 300 may be physically and electrically connected to the package substrate 500 through pillars 360 and solder balls 350. The pillars 360 may be provided on surfaces of the lower lines 335. Each of the pillars 360 may have, for example, a circular pillar shape or a polygonal pillar shape. The pillars 360 may be formed of a conductive material and may include a metal, such as copper, nickel, or silver. The solder balls 370 may be provided on lands 510 of the package substrate 500 and in contact with the pillars 360 formed on the surfaces of the lower lines 335 of the lower semiconductor device 300. The pillars 360 may have, for example, a greater vertical height than lands 510, and they may contact a lower surface of lower lines 335.

Referring to FIGS. 7 through 10, the TSV plugs 305 according to example embodiments may overlap and be aligned with the pillars 360 and the solder balls 370. The TSV plugs 305 may neither overlap nor be aligned with outer regions R52, R53, R62, R63, R72, R73, R82, and R83 of the solder balls 370 but may overlap and be aligned with central regions R51, R61, R71, and R81 of the solder balls 370 or the pillars 360. For example, each of the central regions R51, R61, R71, and R81 may have a circular shape and include about 60 to 70% of the diameter of the solder ball 370 from the central axis C thereof. Accordingly, each of the outer regions R52, R53, R62, R63, R72, R73, R82, and R83 may have a disc shape and include about 15 to 20% of the diameter of the solder ball 370 from outer end portions of the solder ball 370. Each of the pillars 360 may have a circular shape and have about 60 to 70% of the diameter of the solder ball 370 from the central axis C thereof.

Figure 7:
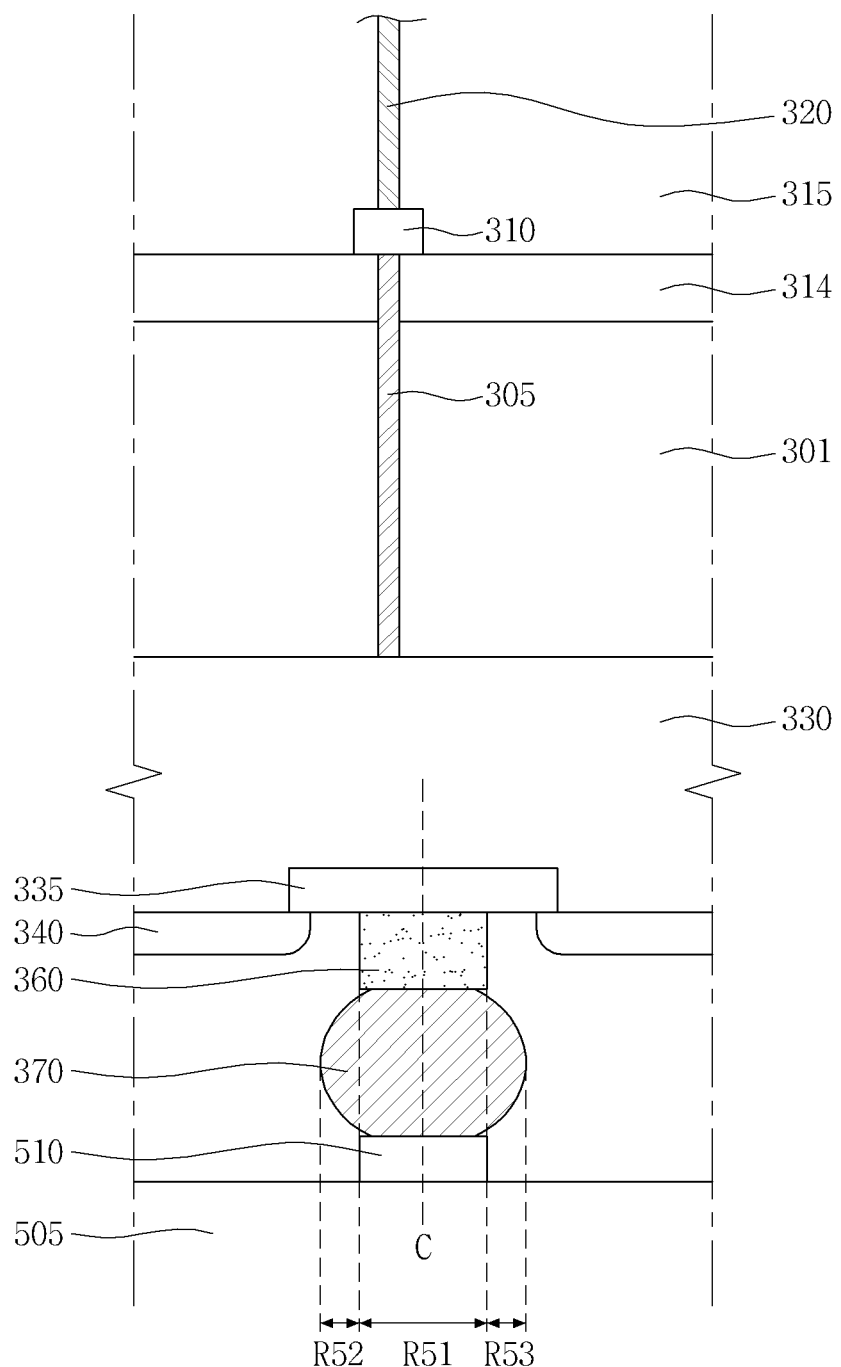
FIGS. 7 through 10 are longitudinal sectional views showing a connection relationship between a TSV plug and a pillar of FIG. 6 according to example embodiments.
Figure 8:
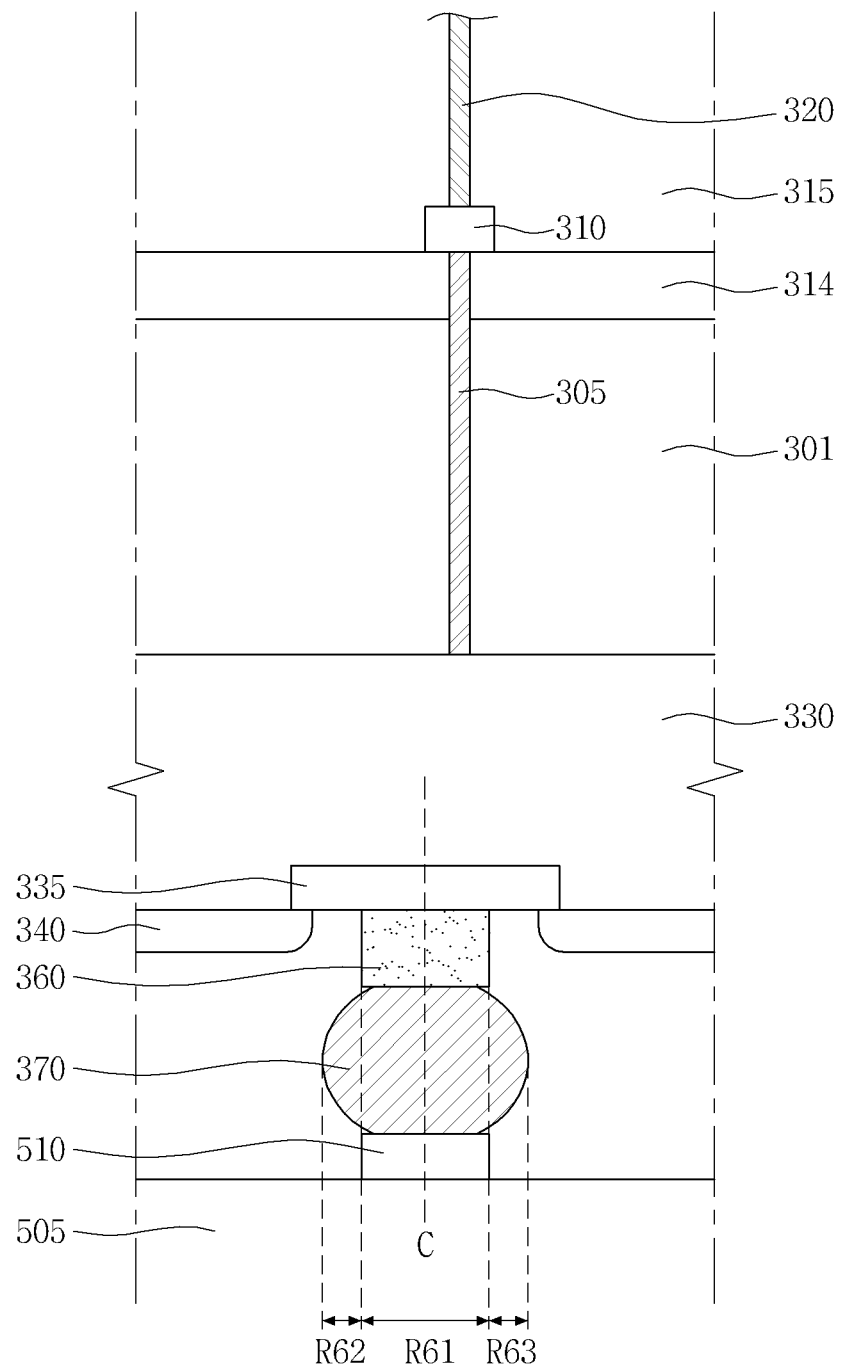

Referring to FIGS. 7 and 8, the TSV plug 305 may vertically overlap and be vertically aligned with the central regions R51 and R61 of the solder ball 370 or the pillar 360, respectively, but may neither overlap nor be aligned with the central axis C. Thus, in certain embodiments, a diameter of a TSV plug may be equal to or less than 30-35% of the diameter of a corresponding solder ball with which it vertically overlaps. For example, a first one of the TSV plugs 305 may be vertically aligned at the left side of any one of the pillars 360, and a second one of the TSV plugs 305 may be vertically aligned at the right side of any one of the pillars 360.

Figure 9:
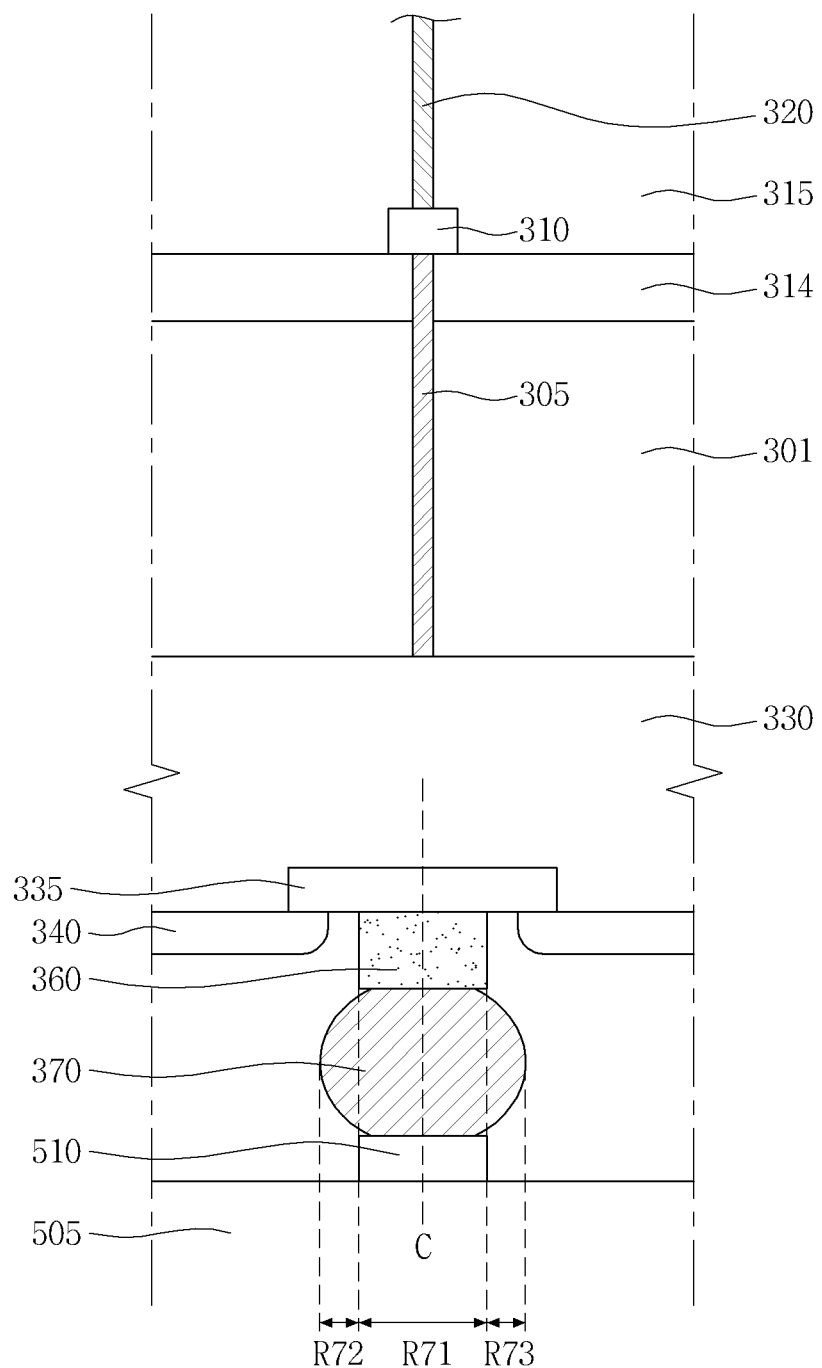

Referring to FIG. 9, the TSV plug 305 may vertically overlap and be vertically aligned with the central region R71 of the solder ball 370 or the pillar 360 and overlap and be aligned with the central axis C. For example, a third one of the TSV plugs 305 may be vertically aligned with a central axis C of any one of the solder balls 370 or the pillars 360.

Figure 10:
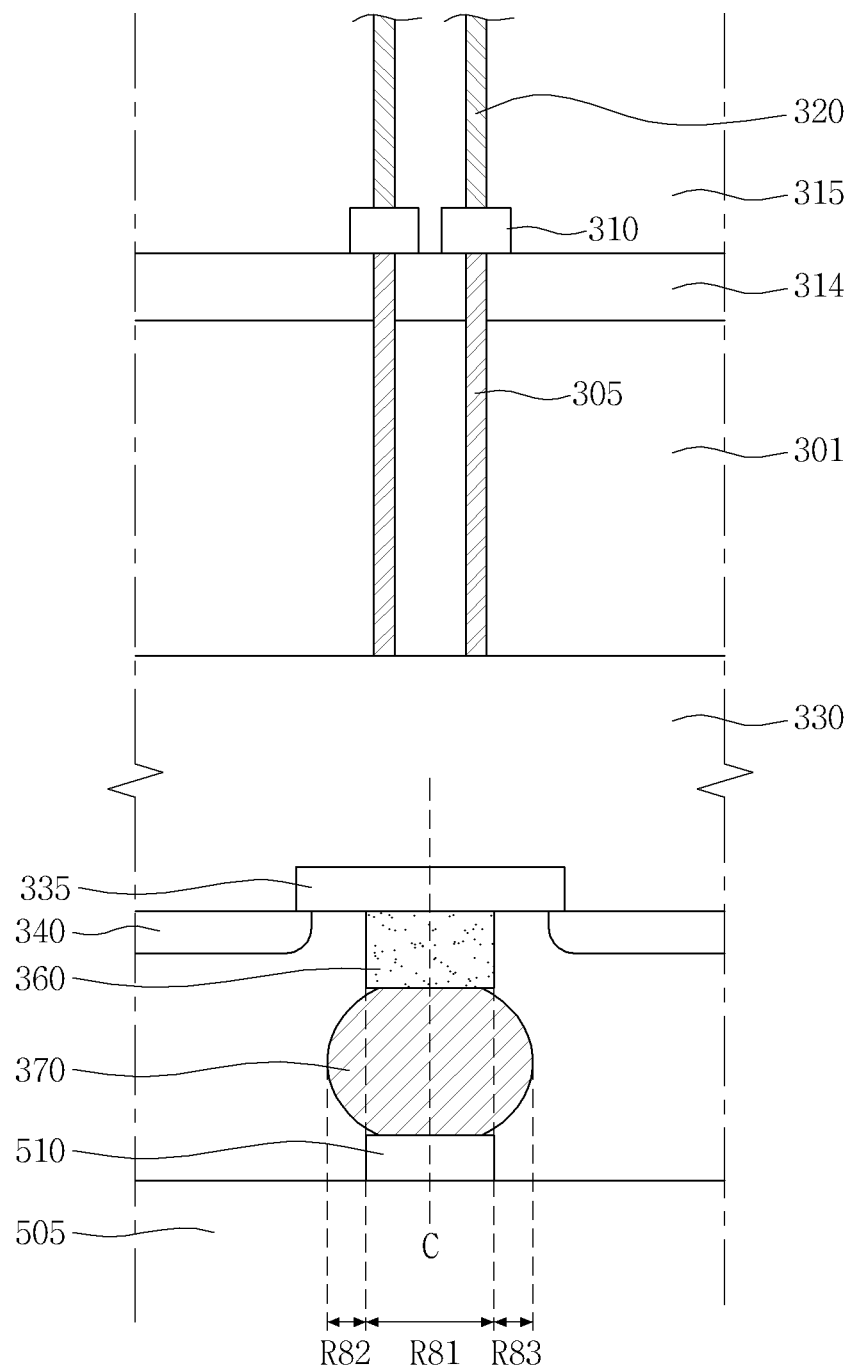

Referring to FIG. 10, at least two TSV plugs 305 may vertically overlap and be vertically aligned with the central region R81 of the solder ball 370 or the pillar 360 (e.g., a central region of a single solder ball or the single pillar). For example, both fourth and fifth ones of the TSV plugs 305 may be vertically aligned with one of the pillars 360. Each TSV plug may have a diameter, for example, of less than 30% of the diameter of the solder ball with which both TSV plugs vertically overlap.

In one embodiment, since the TSV plugs 305 may be irregularly arranged in the lower substrate 301 from a top view or a cross-sectional view, and vertically aligned with the central regions R51, R61, R71, and R81 corresponding to about 60 to 70% of the diameters of the solder balls 370 from the central axes C thereof or vertically aligned with the pillars 360, stress caused between the TSV plugs 305 and the solder balls 370 may be alleviated. Accordingly, occurrence of cracks and delamination in the lower substrate 301 may be prevented.

Figure 11:
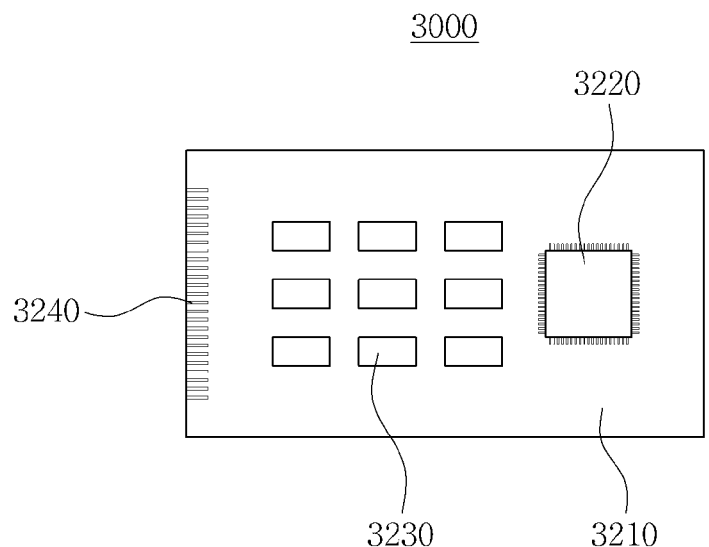
FIG. 11 is a conceptual diagram of a semiconductor module according to certain embodiments.

FIG. 11 is a conceptual diagram of a semiconductor module 3000 according to certain embodiments.

Referring to FIG. 11, the semiconductor module 3000 may include a processor 3220 and semiconductor devices 3230 mounted on a module substrate 3210. The processor 3220 or the semiconductor devices 3230 may include at least one of semiconductor devices 300 of FIGS. 1 and 6. Input/output (I/O) terminals 3240 may be disposed on at least one side of the module substrate 3210.

Figure 12:
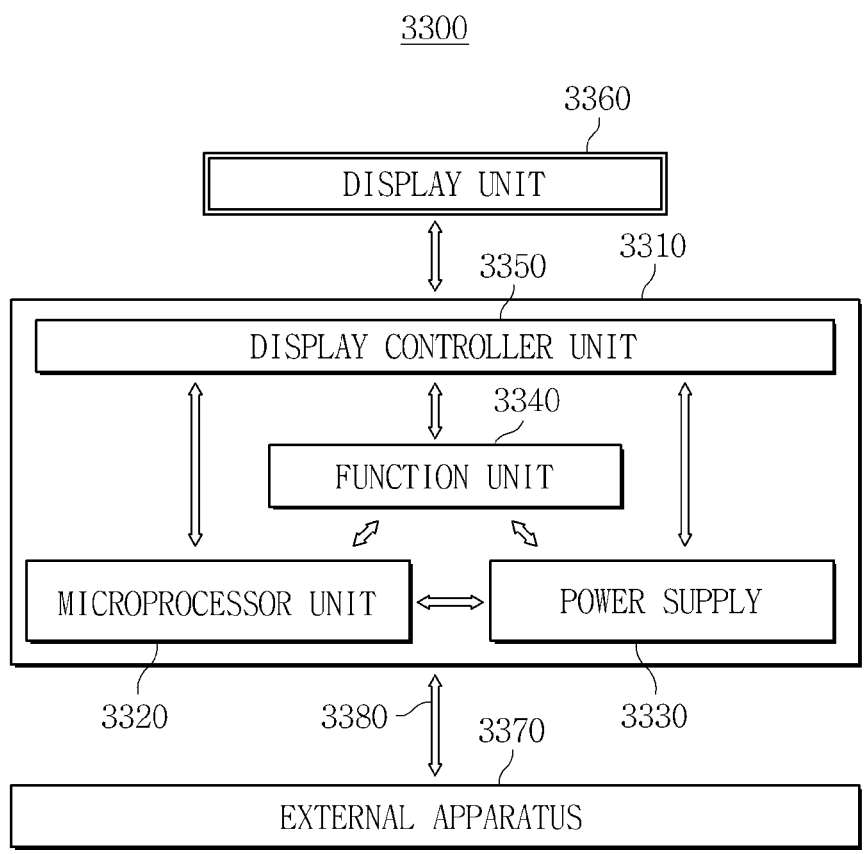
FIGS. 12 and 13 are conceptual block diagrams of electronic systems according to certain embodiments.
Figure 13:
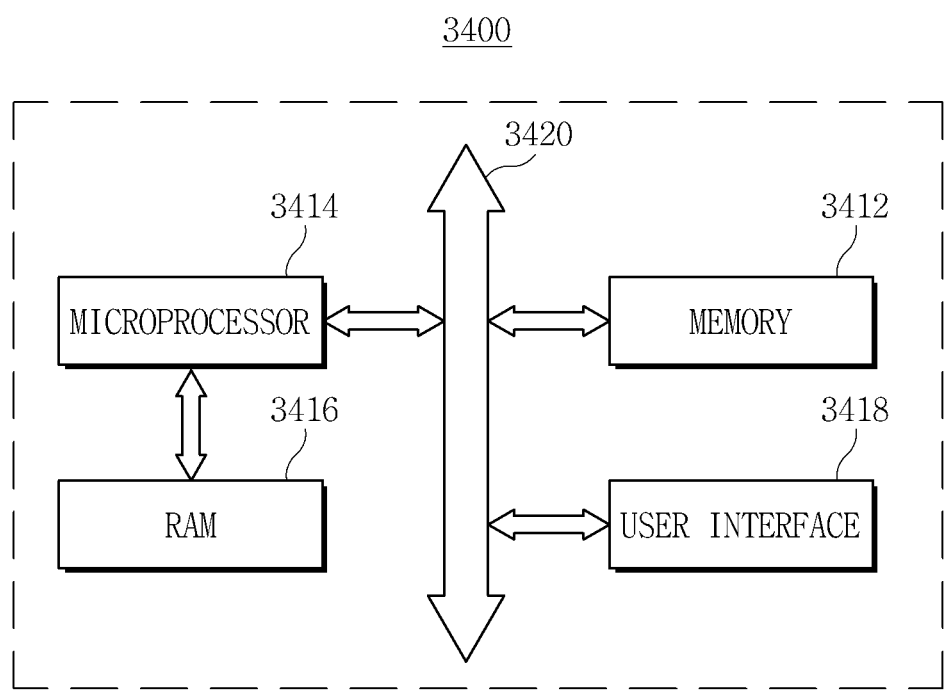

FIGS. 12 and 13 are conceptual block diagrams of electronic systems 3300 and 3400 according to certain embodiments.

Referring to FIG. 12, the electronic system 3300 according to the embodiments of the inventive concept may include a body 3310, a display unit 3360, and an external apparatus 3370.

The body 3310 may include a microprocessor (MP) unit 3320, a power supply 3330, a function unit 3340, and/or a display controller unit 3350. The body 3310 may include a system board or motherboard having a printed circuit board (PCB) and/or a case. The MP unit 3320, the power supply 3330, the function unit 3340, and the display controller unit 3350 may be mounted or disposed on a top surface of the body 3310 or in the body 3310. The display unit 3360 may be disposed on the top surface of the body 3310 or inside/outside the body 3310.

The display unit 3360 may display an image processed by the display controller unit 3350. For example, the display unit 3360 may include, for example, a liquid crystal display (LCD), an active-matrix organic light emitting diode (AMOLED), or various display panels. The display unit 3360 may include a touchscreen. Accordingly, the display unit 3360 may have an input/output (I/O) function.

The power supply 3330 may supply currents or voltages to the MP unit 3320, the function unit 3340, and the display controller unit 3350. The power supply 3330 may include a charging battery, a battery socket, or a voltage-to-current converter.

The MP unit 3320 may receive a voltage from the power supply 3330 and control the function unit 3340 and the display unit 3360. For example, the MP unit 3320 may include a central processing unit (CPU) or an application processor (AP).

The function unit 3340 may implement various functions. For example, the function unit 3340 may include a touchpad, a touchscreen, a volatile/nonvolatile memory, a memory card controller, a camera, a light, a voice/moving image reproduction processor, a wireless transceiving antenna, a speaker, a mike, a universal serial bus (USB) port, or units having various other functions.

The MP unit 3320 or the function unit 3340 may include at least one of semiconductor devices 300 or semiconductor packages 1000 and 2000 of FIGS. 1 and 6.

Referring to FIG. 13, the electronic system 3400 according to certain embodiments of the inventive concept may include a MP 3414, a memory system 3412, and a user interface 3418, which may perform data communication through a bus 3420. The MP 3414 may include a CPU or an AP. The electronic system 3400 may further include a random access memory (RAM) 3416 configured to directly communicate with the MP 3414.

The MP 3414 and/or the RAM 3416 may be assembled in a single package. The user interface 3418 may be used to input information to the electronic system 3400 or output information from the electronic system 3400. For instance, the user interface 3418 may include a touchpad, a touchscreen, a keyboard, a mouse, a scanner, a voice detector, a cathode ray tube (CRT) monitor, an LCD, an AMOLED, a plasma display panel (PDP), a printer, a light, or various other I/O devices.

The memory system 3412 may store codes for operating the MP 3414, data processed by the MP 3414, or external input data. The memory system 3412 may include a memory controller, a hard disk, or a solid-state drive (SSD). The MP 3414, the RAM 3416, and/or the memory system 3412 may include at least one of semiconductor devices 300 or semiconductor packages 1000 and 2000 of FIGS. 1 and 6.

According to embodiments of the disclosure, a semiconductor device and a semiconductor package including the same can reduce stress caused between TSV plugs and solder balls (or pillars) interposed between the TSV plugs and a package substrate. Thus, occurrence of cracks in upper and lower portions of a semiconductor substrate can be reduced to lessen delamination. As a result, a semiconductor chip can be protected to ensure better reliability.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this disclosure as defined in the claims. In the claims, means-plus-function clauses are intended to cover the structures described herein as performing the recited function, and not only structural equivalents but also equivalent structures.

What is claimed is:

1. A semiconductor package comprising:
a package substrate having lands;
a first semiconductor chip mounted on the package substrate, and including a first substrate, through-substrate via plugs vertically passing through the first substrate, first lines on a bottom surface on the first substrate and through-substrate via pads on a top surface of the first substrate; and
solder balls respectively electrically connected to the lands of the package substrate and the first lines of the first semiconductor chip,
wherein the through-substrate via pads are respectively vertically aligned with the through-substrate via plugs,
wherein the through-substrate via plugs include first through-substrate via plugs which are respectively vertically aligned with the first lines and overlap first regions corresponding to 70% or less of diameters of the solder balls from central axes of the solder balls, and second through-substrate via plugs which are arranged so that each first through-substrate via plug has a corresponding adjacent second through-substrate via plug and which do not overlap second regions corresponding to the remaining 30% or more of diameters of the solder balls from the central axes of the solder balls, and
wherein a first distance between first and second through-substrate via plugs of a first pair of the through-substrate via plugs is different from a second distance between first and second through-substrate via plugs of a second pair of the through-substrate via plugs.

2. The semiconductor package of claim 1, wherein the through-substrate via plugs of the first semiconductor chip include a third through-substrate via plug disposed between one of the first through-substrate via plugs and a corresponding adjacent second through-substrate via plug, and do not vertically overlap the second region of the solder ball, and
wherein a first interval between the third through-substrate via plug and the corresponding first through-substrate via plug is different from a second interval between the corresponding first through-substrate via plug and the corresponding second through-substrate via plug.

3. The semiconductor package of claim 1, wherein at least one of the second through-substrate via plugs vertically overlaps one of the first regions of the solder balls.

4. The semiconductor package of claim 3, when the first through-substrate via plug and the corresponding second through-substrate via plug of a first air of the through-substrate via plugs vertically overlap a first solder ball of the solder balls the first through-substrate via plug of the first pair of the through-substrate via plugs is vertically aligned at the left side of the first region of the first solder ball, and the second through-substrate via plug of the first pair of the through-substrate via plugs is vertically aligned at the right side of the first region of the first solder ball.

5. The semiconductor package of claim 1, wherein adjacent ones of the first lines are arranged at regular intervals with respect to each other.

6. The semiconductor package of claim 1, further comprising pillars disposed between the first lines and the solder balls and having a smaller horizontal width than the first lines.

7. The semiconductor package of claim 6, wherein the pillars are vertically aligned to overlap the through-substrate via plugs.

8. The semiconductor package of claim 1, wherein the first semiconductor chip further comprises:
a first insulating layer between a bottom surface of the first substrate and the first lines; and
a passivation layer on the first insulating layer to partially expose the first lines.

9. The semiconductor package of claim 8, wherein the first insulating layer covers end portions of the through-substrate via plugs.

10. The semiconductor package of claim 1, wherein the first semiconductor chip further comprises:
a first insulating layer between the top surface of the first substrate and the through-substrate via pads;
a second insulating layer on the first insulating layer to cover the through-substrate via pads;
internal vias vertically passing through the second insulating layer and connected to the through-substrate via pads; and
first pads disposed on the second insulating layer and connected to the internal vias,
wherein the internal vias vertically overlap the through-substrate via plugs, and the first pads respectively vertically overlap the through-substrate via pads.

11. The semiconductor package of claim 10, wherein each of the through-substrate via pads contacts a corresponding through-substrate via plug.

12. The semiconductor package of claim 10, further comprising a second semiconductor chip stacked on the first semiconductor chip,
- wherein the second semiconductor chip comprises:
  - a second substrate; and
  - second pads disposed on a bottom surface of the second substrate,
  - wherein the second pads of the second semiconductor chip respectively vertically overlap the first pads of the first semiconductor chip.

13. The semiconductor package of claim 12, further comprising inter-chip bumps disposed between the first pads and the second pads to electrically connect each of the first pads to the corresponding second pad.

* * * * *